United States Patent [19]
Fry

[11] 3,937,984
[45] Feb. 10, 1976

[54] SHIFT REGISTERS
[75] Inventor: Peter William Fry, Dorchester, England
[73] Assignee: Integrated Photomatrix Limited, Dorchester, England
[22] Filed: Oct. 7, 1974
[21] Appl. No.: 512,490

[30] Foreign Application Priority Data
July 25, 1974  United Kingdom............ 32981/74

[52] U.S. Cl............ 307/221 C; 307/224 C; 307/269
[51] Int. Cl.² ................ G11C 19/28; G11C 19/18; H03K 1/17
[58] Field of Search........ 307/221 R, 221 C, 221 D, 307/224 C, 269, 304

[56] References Cited
UNITED STATES PATENTS

| 3,575,609 | 4/1971 | Izumi............................. 307/221 C |
| 3,621,291 | 11/1971 | Fujimoto........................ 307/304 X |
| 3,702,945 | 11/1972 | Faith et al...................... 307/304 X |
| 3,808,458 | 4/1974 | Mundy et al.................... 307/221 C |
| 3,829,711 | 8/1974 | Crowle........................... 307/221 C |

Primary Examiner—John S. Heyman
Assistant Examiner—Larry N. Anagnos
Attorney, Agent, or Firm—Klarquist, Sparkman, Campbell, Leigh, Hall & Whinston

[57] ABSTRACT

A shift register stage comprises an MOS gating transistor having its drain and source electrodes connected respectively to an input node receiving pulses to be shifted through the stage and a gate electrode of an MOS amplifying transistor. A capacitor is connected between the gate and source electrodes of the amplifying transistor. The source electrode of the amplifying transistor constitutes the output of the stage and is connected to the drain electrode of a current source transistor having its source electrode connected to an earth line and its gate electrode connected to a reference potential. The gate electrode of the gating transistor is connected to receive a first series of clock pulses, and the drain electrode of the amplifying transistor is connected to receive another series of clock pulses in non-overlapping relation with the first series.

6 Claims, 3 Drawing Figures

SHIFT REGISTERS

BACKGROUND OF THE INVENTION

This invention relates to shift registers and stages thereof.

It is an object of the invention to provide a shift register stage which is economical in its use of components.

SUMMARY OF THE INVENTION

Accordingly, the present invention provides a shift register stage comprising an input node for receiving pulses to be shifted through the stage, an input gate means which is connected between the input node and a non-inverting signal input of an amplifying element and which has a control electrode for receiving one series of clock pulses, charge storage means connected between the signal input of the amplifying element and an output of the amplifying element which constitutes the output of the stage, and a current source connected between the output of the amplifying element and a clock pulse reference potential, the amplifying element having a current input for receiving another series of clock pulses in non-overlapping relation with the pulses of the first series.

In an embodiment of the invention, the amplifying element comprises a metal-oxide semiconductor field-effect amplifying transistor, the gate electrode of which constitutes the non-inverting signal input and the current-carrying electrodes of which respectively constitute the output and current input of the amplifying element.

Preferably, the input gate means comprises a metal oxide semi-conductor field-effect gating transistor having its current-carrying electrodes connected respectively to the input node and the non-inverting signal input of the amplifying element, and its gate electrode connected to receive the said one series of clock pulses.

Conveniently, the charge storage means comprises a capacitor connected between the signal input and the output of the amplifying element.

According to a preferred feature, the current source comprises a metal-oxide semiconductor field-effect current source transistor having its current-carrying electrodes connected respectively to the output of the amplifying element and the clock pulse reference potential, and its gate electrode connected to receive a second reference potential adapted to bias the current source transistor for conduction.

The invention also provides a shift register comprising a plurality of stages according to the invention, in which register the output of each stage is connected to the input node of the succeeding stage, and the current input of the amplifying element in each stage is connected to receive the same series of clock pulses as the input gate means of the succeeding stage.

BRIEF DESCRIPTION OF THE DRAWINGS

In order that the invention may be readily understood, embodiments thereof will now be described in more detail, by way of example, with reference to the appended drawings, in which.

DESCRIPTION OF PREFERRED EMBODIMENTS

Figure 1:
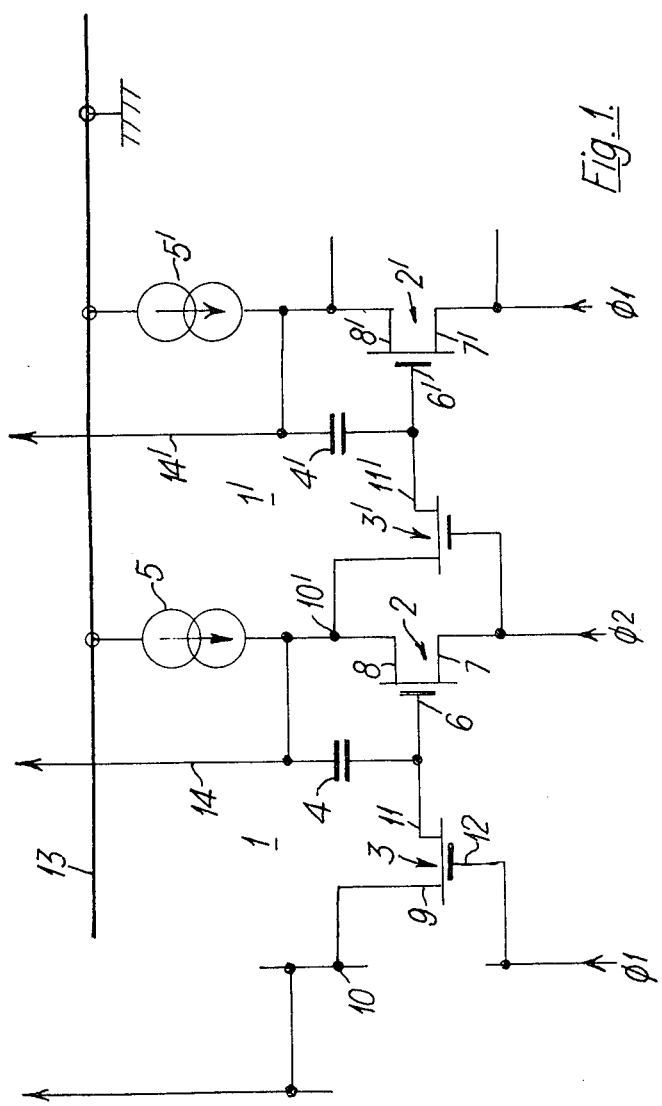
FIG. 1 is a circuit diagram illustrating two stages of a shift register embodying the invention.

FIG. 1 illustrates the circuitry of two stages 1 and 1' of a shift register embodying the invention. In the two stages 1, 1' like parts are indicated by like reference numerals, with the addition of a prime in the case of stage 1'. Each stage 1, 1' comprises: a p-channel enhancement mode MOS transistor 2, 2' constituting an amplifying element; a p-channel enhancement mode MOS transistor 3, 3' constituting an input gate; a capacitor 4, 4' constituting charge storage means; and a current source 5, 5'.

Referring to register stage 1, the transistor 2 has a gate 6 constituting a non-inverting signal input electrode, a drain 7 constituting a supply current input electrode and a source 8 constituting an output electrode.

The input gate 3 has its drain 9 connected to an input node 10 of stage 1 and its source 11 connected to the gate 6 of transistor 2. The gate 12 of transistor 3 is connected to a supply of a first series of negative-going clock pulses $\phi_1$.

The current source 5 is connected between the source 8 of transistor 2 and an earth rail 13, while the drain 7 of the transistor 2 is connected to a supply of a second series of negative-going clock pulses $\phi_2$ which do not overlap the clock pulses $\phi_1$. The capacitor 4 is connected between the gate 6 and source 8 of the transistor 2.

The output signal of stage 1 is delivered on line 14 and is also applied to the input node 10' of the stage 1' which is the same as stage 1 except that the gate 12' of transistor 3' is connected to receive the second series of clock pulses $\phi_2$ and the drain 7' of transistor 2' is connected to receive the first series of clock pulses $\phi_1$. In a complete register stages like stage 1 alternate with stages like stage 1'.

If stage 1 is the first stage of the register, input node 10 constitutes the input of the register; otherwise, node 10 is connected to receive the output of the preceding stage.

The operation of the FIG. 1 circuit will now be described with reference to the waveforms shown in FIG. 2.

Assume that all potentials in the circuit are zero just prior to time T1 and that the input node 10 receives a negative-going pulse which commences simultaneously with negative-going clock pulse $\phi_1$ of magnitude $-V\phi$ at time T1. At this time, therefore, transistor 3 is turned on by the clock pulse and the gate 6 of transistor 2 is charged from input node 10 through transistor 3 to a potential which is one MOS transistor threshold voltage positive relative to clock pulse $\phi_1$. The output line 14 of stage 1 being held to earth potential by the positive current source 5, the capacitor 4 becomes charged to the potential of the gate 6.

At time T2, the clock pulse $\phi_1$ and the potential of input node 10 return to zero potential together. However, since the MOS transistor 3 is turned off by the removal of the negative potential from its gate 12, the gate 6 of transistor 2 remains at its acquired negative potential.

At time T3, negative-going clock pulse $\phi_2$ of magnitude $-V\phi$ is applied to the drain 7 of transistor 2. Since transistor 2 is biased for conduction by the gate-source potential difference held on capacitor 4, the potential of output line 14 of stage 1 goes negative at the same time, until the potential difference between the source 8 and drain 7 of transistor 2 is just sufficient to maintain a current equal to that of current source 5. This source-drain potential difference can be made as small as desired by a suitable choice of current source 5. Since the potential difference across capacitor 4 is maintained during this time, the voltage on the gate 6 of transistor 2 becomes more negative than that on the output line 14 by an amount equal to the potential difference across the capacitor. The negative-going clock pulse $\phi_2$ is also applied to the gate 12' of transistor 3' in the stage 1' at time T3, so that transistor 3' is turned on and the gate 6' of transistor 2' becomes charged from input node 10' through transistor 3' to a potential which is one MOS threshold potential positive with respect to the clock pulse $\phi_2$.

At time T4, clock pulse $\phi_2$ returns to zero potential and, as transistor 2 is still held in a conducting state by the potential difference across capacitor 4, output line 14 is therefore discharged through transistor 2 to zero potential at the same time and the potential of gate 6 of transistor 2 falls back to the value it had during the period T1 and T3. Since transistor 3' is turned off by the removal of clock pulse $\phi_2$, gate 6' of transistor 2' remains negatively charged.

At time T5, another negative-going clock pulse $\phi_1$ occurs and, as the potential difference across capacitor 4' holds transistor 2' in a conducting state, the potential on output line 14' of stage 1' goes negative until transistor 2' is just maintaining a current equal to that of current source 5'. As in the case of the output line 14 of stage 1, the output line 14' can be brought to within a fraction of a volt of the potential of clock pulse $\phi_1$. The potential of gate 6' goes further negative by an amount equal to the potential of output line 14'. In stage 1, where the clock pulse $\phi_1$ at time T5 is applied to the gate 12 of transistor 3, transistor 3 is turned on so that capacitor 4 is discharged by current source 5 and the potential of gate 6 falls to 0.

At time T6, clock pulse $\phi_1$ returns to zero potential, output line 14' is discharged to 0 potential by the still conducting transistor 2', and the potential of gate 6' of transistor 2' falls to the value which it had during the period T3 to T5.

Finally, at time T7, a further clock pulse $\phi_2$ turns on transistor 3' and the potential of gate 6' is discharged to 0.

Figure 2:
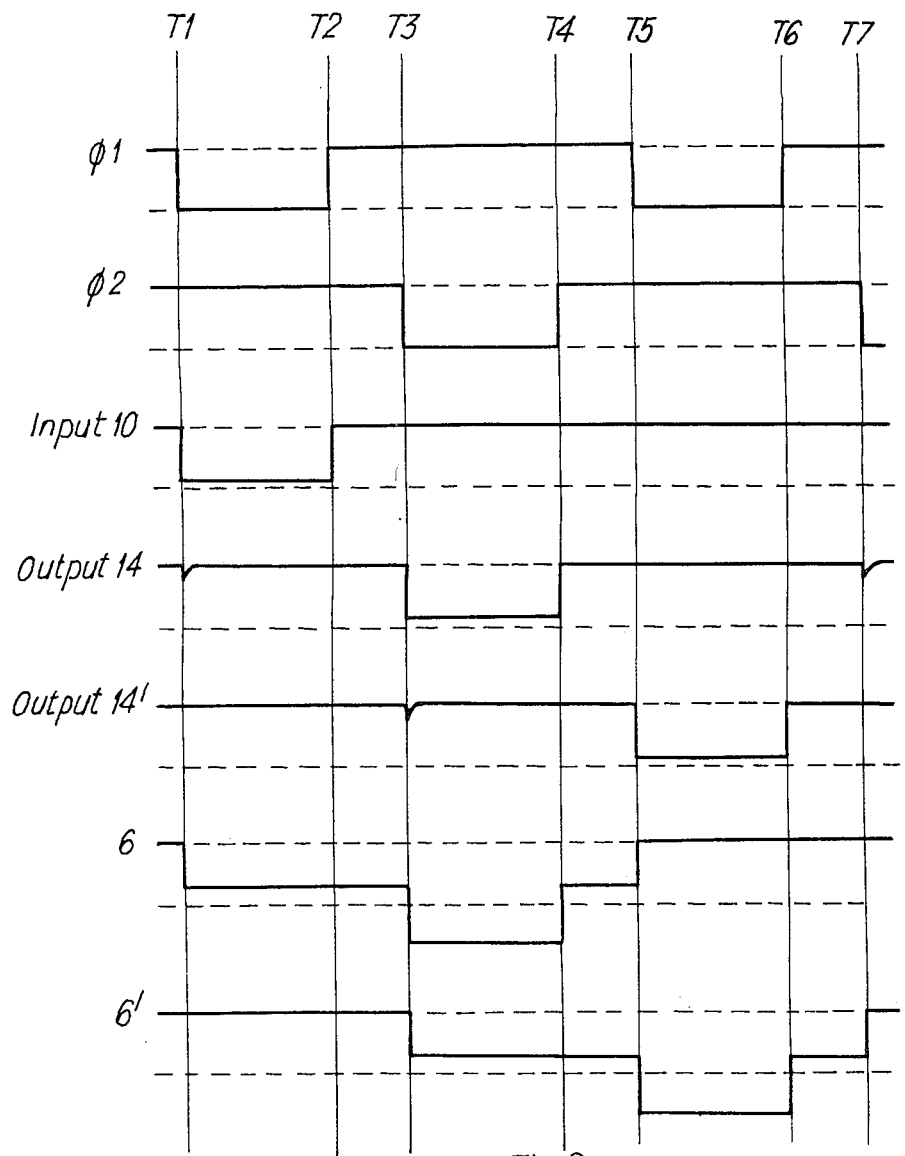
FIG. 2 is a timing diagram showing the potentials at various points of the FIG. 1 circuit during operation of the shift register.

Thus, as can be seen from the waveforms of FIG. 2, a negative pulse applied at input node 10 is propagated to the outputs 14, 14' in turn in response to successive clock pulses.

Figure 3:
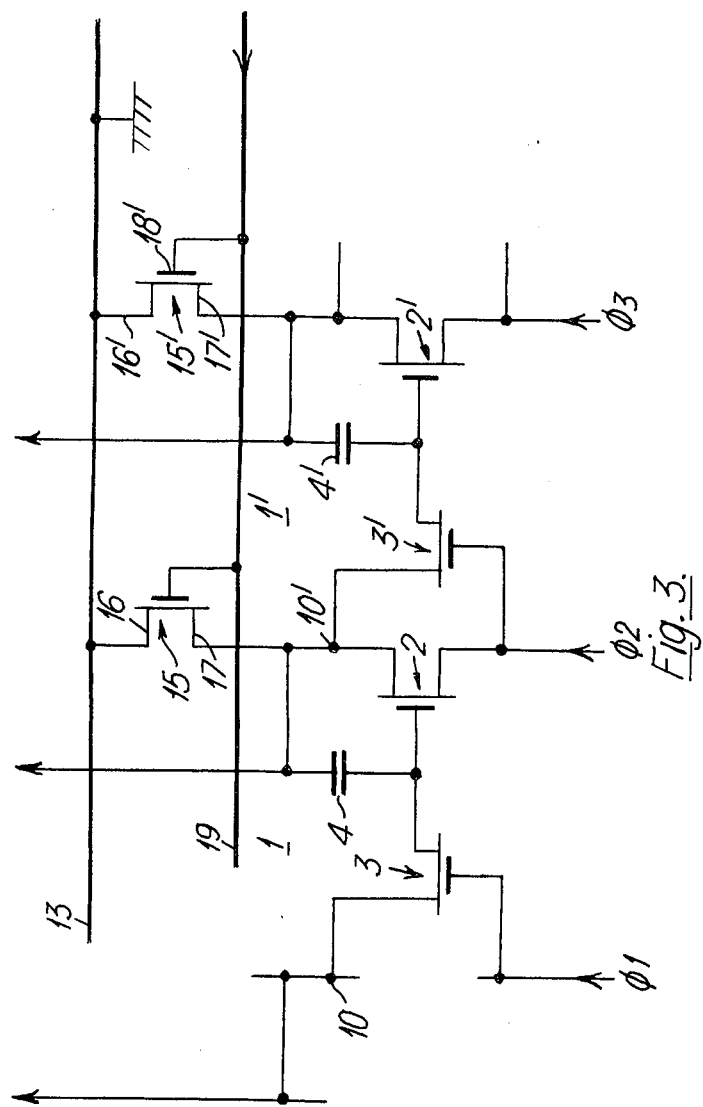
FIG. 3 is a circuit diagram like that of FIG. 1 illustrating the use of metal-oxide semiconductor (MOS) field-effect transistors as the current sources for the shift register stages.

As shown in FIG. 3, the current source 5, 5' may be a further MOS transistor 15, 15' having its source 16, 16' connected to earth line 13, its drain 17, 17' connected to the respective output line 14, 14', and its gate 18, 18' connected to a reference supply line 19 at a potential somewhat above the threshold voltage of the transistor 15.

As can be seen from FIG. 3 each register stage 1, 1' only requires three MOS transistors in contrast to known register stages employing MOS transistors which require at least six transistors per register stage.

I claim:

1. A shift register stage comprising:

an input node for receiving pulses to be shifted through the stage;
a single amplifying element having a non-inverting signal input electrode, a current input electrode and an output electrode which constitutes the output of the stage;
an input gate means which is connected between the input node and the signal input electrode of the amplifying element, said input gate means having a control electrode;
charge storage means connected between the signal input electrode and the output electrode of the amplifying element; and
a current source connected between the output electrode of the amplifying element and a clock pulse reference potential, said current source having a control electrode connected to a second reference potential continuously biasing the current source for conduction;
said control electrode of said input gate means being connected to receive one series of clock pulses;
said current input electrode of said amplifying element being connected to receive another series of clock pulses in non-overlapping relation with the pulses of the first series.

2. A shift register stage as claimed in claim 1, wherein the amplifying element comprises a metal-oxide semiconductor field-effect amplifying transistor having a gate electrode which constitutes the non-inverting signal input electrode and current-carrying electrodes which respectively constitute the output electrode and the current input electrode of the amplifying element.

3. A shift register stage as claimed in claim 1, wherein the input gate means comprises a metal-oxide semiconductor field-effect gating transistor having current-carrying electrodes connected respectively to the input node and the signal input electrode of the amplifying element and a gate electrode connected to receive the said one series of clock pulses.

4. A shift register stage as claimed in claim 1, wherein the charge storage means comprises a capacitor connected between the signal input electrode and the output electrode of the amplifying element.

5. A shift register stage as claimed in claim 1, wherein the current source comprises a metal-oxide semiconductor field-effect current source transistor having current-carrying electrodes connected respectively to the output of the amplifying element and the clock pulse reference potential and a gate electrode connected to receive said second reference potential adapted to bias the current source transistor for conduction.

6. A shift register circuit comprising:
a plurality of stages, each stage including an input node for receiving pulses to be shifted through the stage; a single amplifying element having a non-inverting signal input electrode, a current input electrode and an output electrode which constitutes the output of the stage; an input gate means which is connected between the input node and the signal input electrode of the amplifying element, said input gate means having a control electrode; charge storage means connected between the signal input electrode and the output electrode of the amplifying element; and a current source connected between the output electrode of the amplifying element and a clock pulse reference potential, said current source having a control electrode connected to a second reference potential continuously biasing the current source for conduction;

means connecting the output electrode of at least selected of said stages to the respective input node of the next succeeding stage in the shift register circuit, the said control electrode of a said input gate means for a given stage being connected to receive a first series of clock pulses, and said current input electrode of said amplifying element of the same given stage being connected to receive a second series of clock pulses in non-overlapping relation with the pulses of the first series, and wherein a next succeeding stage following said given stage has the control electrode of its input gate means connected to receive the second series of clock pulses, and the current input electrode of its amplifying element connected to receive said first series of clock pulses.

* * * * *